(12) United States Patent
Matsumoto et al.

(10) Patent No.: US 9,691,498 B2
(45) Date of Patent: Jun. 27, 2017

(54) SEMICONDUCTOR INTEGRATED CIRCUIT (71) Applicant: KABUSHIKI KAISHA TOSHIBA, Tokyo (JP)

(72) Inventors: Mari Matsumoto, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/064,102

(22) Filed: Mar. 8, 2016

(65) Prior Publication Data

US 2016/0276018 A1 Sep. 22, 2016

(30) Foreign Application Priority Data

Mar. 19, 2015 (JP) ................. 2015-056340

(51) Int. Cl.
*G11C 13/00* (2006.01)
*G11C 5/02* (2006.01)
*G11C 5/06* (2006.01)
*G11C 17/16* (2006.01)
*H03K 19/177* (2006.01)

(52) U.S. Cl.
CPC .......... *G11C 17/16* (2013.01); *H03K 19/1776* (2013.01); *G11C 5/02* (2013.01); *G11C 5/06* (2013.01); *G11C 13/0002* (2013.01); *G11C 13/003* (2013.01); *G11C 13/0004* (2013.01); *G11C 2213/77* (2013.01)

(58) Field of Classification Search
CPC ........... G11C 13/0002; G11C 13/0004; G11C 13/003; G11C 2213/77; G11C 5/02; G11C 5/06

USPC ..................... 365/148, 158, 51, 63
See application file for complete search history.

(56) References Cited

U.S. PATENT DOCUMENTS

| | | | |
|---|---|---|---|
| 5,200,652 | A | 4/1993 | Lee |
| 5,600,264 | A | 2/1997 | Duong et al. |
| 6,002,610 | A | 12/1999 | Cong et al. |
| 6,323,678 | B1 | 11/2001 | Azegami |
| 6,667,902 | B2 | 12/2003 | Peng |

(Continued)

FOREIGN PATENT DOCUMENTS

| | | |
|---|---|---|
| JP | 3614264 | 1/2005 |
| JP | 4512752 | 7/2010 |

(Continued)

*Primary Examiner* — Ly D Pham
(74) *Attorney, Agent, or Firm* — Finnegan, Henderson, Farabow, Garrett & Dunner LLP (57) ABSTRACT

A semiconductor integrated circuit according to an embodiment includes a plurality of first wiring lines electrically connected to a plurality of input wiring lines; a plurality of second wiring lines electrically connected to a plurality of output wiring lines, the second wiring lines crossing the first wiring lines; and a plurality of cell arrays each of which includes memory elements disposed at intersection regions of a part of the first wiring lines and a part of the second wiring lines, each of the memory elements including a first terminal and a second terminal, the first terminal being electrically connected to one of the first wiring lines, the second terminal being electrically connected to one of the second wiring lines, and each of the second wiring lines being electrically connected to at most one of the cell arrays.

22 Claims, 11 Drawing Sheets

(56) References Cited

U.S. PATENT DOCUMENTS

| | | |
|---|---|---|
| 8,461,870 B2 | 6/2013 | Hioki |
| 2007/0183181 A1 | 8/2007 | Peng et al. |
| 2010/0259961 A1* | 10/2010 | Fasoli .................... B82Y 10/00 365/51 |
| 2010/0259962 A1* | 10/2010 | Yan ........................ B82Y 10/00 365/51 |
| 2011/0297912 A1* | 12/2011 | Samachisa ........... G11C 13/003 257/5 |
| 2011/0298054 A1 | 12/2011 | Luan |
| 2012/0327698 A1* | 12/2012 | Perner ................. H01L 27/0207 365/72 |
| 2013/0336036 A1* | 12/2013 | Cernea .................... G11C 7/18 365/51 |
| 2014/0003114 A1* | 1/2014 | Pellizzer ............. H01L 27/2481 365/63 |
| 2015/0311900 A1 | 10/2015 | Yasuda et al. |
| 2015/0348631 A1 | 12/2015 | Matsumoto et al. |

FOREIGN PATENT DOCUMENTS

| | | |
|---|---|---|
| JP | 2015-211326 | 11/2015 |
| JP | 2015-230919 | 12/2015 |

* cited by examiner

SEMICONDUCTOR INTEGRATED CIRCUIT

CROSS REFERENCE TO RELATED APPLICATIONS

This application is based upon and claims the benefit of priority from prior Japanese Patent Application No. 2015-056340 filed on Mar. 19, 2015 in Japan, the entire contents of which are incorporated herein by reference.

FIELD

Embodiments described herein relate generally to semiconductor Integrated circuits.

BACKGROUND

Programmable logic switches are used in field programmable gate arrays (FPGAs) and other elements, in which logical operation circuits and wiring circuits need reconfiguration. The programmable switches are turned ON and OFF based on data stored in memories. The memories have conventionally been volatile memories such as static random access memories (SRAMs), in which data is erased when power is turned OFF, and rewritten when power is turned ON again.

Switch block (SB) circuits, which are components of FPGAs, also employ SRAMs to store wiring information. Generally, a switch block circuit connects one of a first group of wiring lines arranged in parallel with one of a second group of wiring lines arranged to cross the first group of wiring lines. Diagonally arranged switch block circuits each having this structure may arbitrarily change the signal paths from one direction to another direction.

The switch block circuits may be applied to multi-input multi-output multiplexers (MUXs) with memories located at intersections of wiring lines. In this circuit configuration, elements may be densely arranged. Therefore the circuit configuration is effective to reduce the area. Using one time programmable (OTP) elements or resistive change elements in memories that store switching information would also help achieve dense arrangements. Regardless of whether OTP elements or resistive change elements are used, the wiring capacitance increases as the number of input lines and output lines increases, which also leads to an increase in the delay time.

DETAILED DESCRIPTION

A semiconductor integrated circuit according to an embodiment includes a plurality of first wiring lines electrically connected to a plurality of input wiring lines; a plurality of second wiring lines electrically connected to a plurality of output wiring lines, the second wiring lines crossing the first wiring lines; and a plurality of cell arrays each of which includes memory elements disposed at Intersection regions of a part of the first wiring lines and a part of the second wiring lines, each of the memory elements including a first terminal and a second terminal, the first terminal being electrically connected to one of the first wiring lines, the second terminal being electrically connected to one of the second wiring lines, and each of the second wiring lines being electrically connected to at most one of the cell arrays.

Before embodiments of the present invention are described, the basic idea of the embodiments will be described.

The semiconductor Integrated circuit of each embodiment includes a multi-input multi-output multiplexer ("multi-input multi-output MUX"). The MUX includes a memory cell array. Dividing the memory cell array into a plurality of sub cell arrays would lead to a shorter delay time as compared to the delay time of a switch block circuit including SRAMs. The rules of the division into a plurality of sub cell arrays will be described below.

Figure 1:
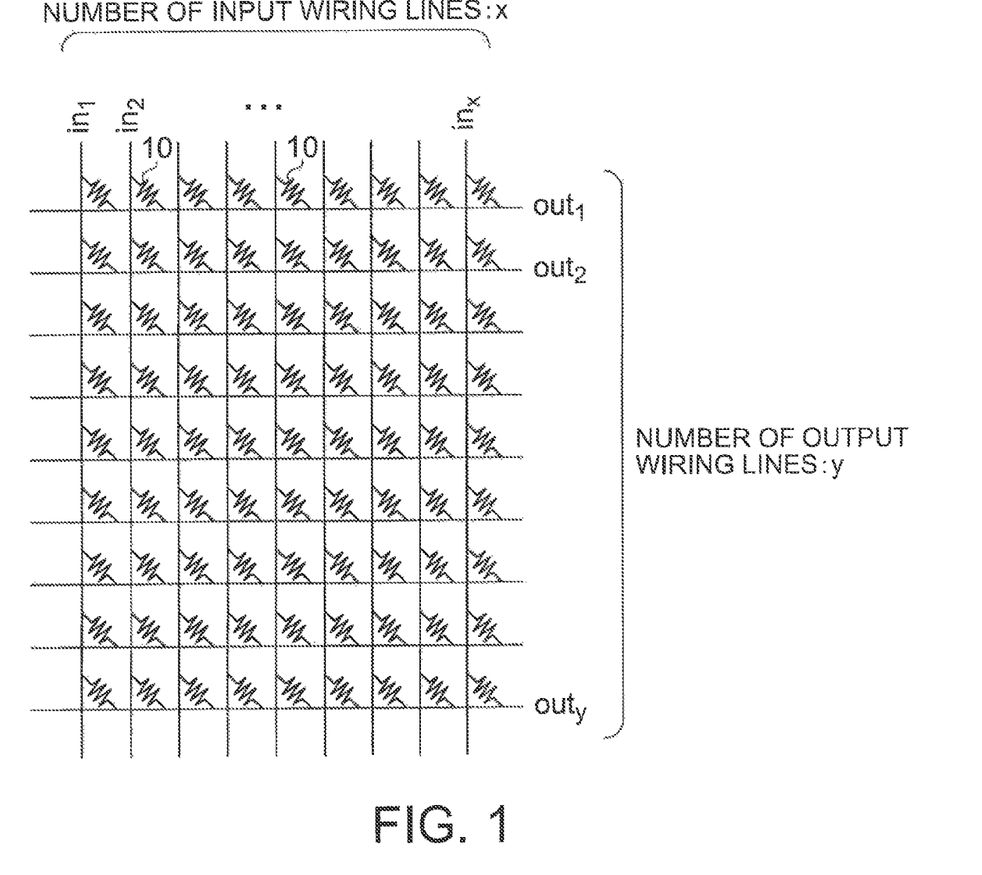
FIG. 1 is a diagram showing a memory cell array.

FIG. 1 shows a memory cell array included in a MUX. The memory cell array includes x input wiring lines and y output wiring lines. Memory cells including memory elements 10 are disposed at intersections of the input lines $in_i$ (i=1, . . . , x) and the output wiring lines $out_j$ (j=1, . . . , y). If the memory element 10 is an anti-fuse memory element, the memory element has a low resistance after it is written, and has a high resistance before it is written. The difference between the low resistance and the high resistance is preferably as high as possible. The memory element 10 may thus serve as a resistive element.

Figure 2:
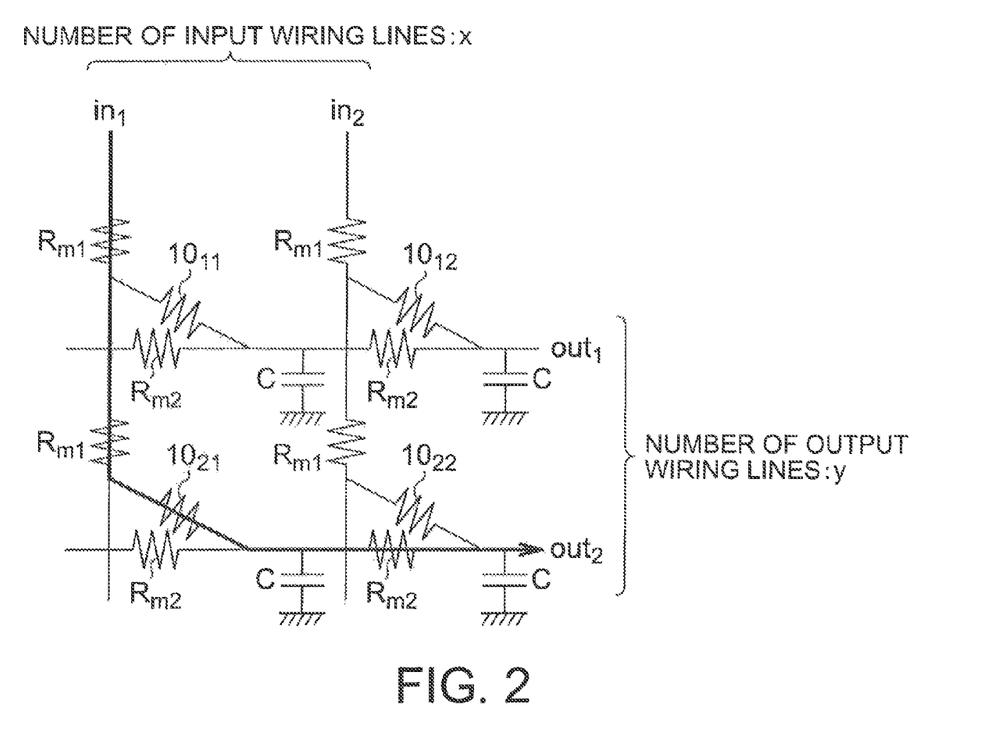
FIG. 2 is a diagram for explaining delay time.

The circuit delay in a cross point type memory cell array as described above is generally calculated roughly by using the Elmore delay model. The Elmore delay model for the memory cell array as shown in FIG. 1 with two input wiring lines and two output wiring lines will be described below with reference to FIG. 2. In this example, it is assumed that data inputted from the Input wiring line $in_1$ passes through the bold solid line and is outputted from the output wiring line $out_2$. The memory element $10_{21}$ at the Intersection of the input wiring line $in_1$ and the output wiring line $out_2$ is written. The resistance after the write operation is assumed to be R. It is also assumed that the resistances of the memory elements $10_{11}$, $10_{12}$, and $10_{22}$ that are written are higher than the resistance of the memory element $10_{21}$ that is written. The wiring resistance per one memory cell region of the input wiring lines $in_1$ and $in_2$ is assumed to be $R_{m1}$, and the wiring resistance per one memory region of the output wiring lines $out_1$ and $out_2$ is assumed to be $R_{m2}$. The wiring capacitance per one memory region is assumed to be C. Then, the delay $T_{21}$ of the path from the input wiring line $in_1$ to the output wiring line out$_2$ can be expressed as follows in accordance with the Elmore delay model.

$$T_{21} = (R_{m1} \times 2 + R + R_{m2}) \times C \times 2 \quad (1)$$

Similarly, the delay of the longest path from the input to the output in the memory cell array with the x input wiring lines and the y output wiring lines shown in FIG. 1, i.e., the path through the Input wiring line In$_1$ and the output wiring line out$_y$, can be expressed by the formula (2) as follows.

$$T_{xy} = \{R_{m1} \times y + R + R_{m2} \times (x-1)\} \times C \times x \quad (2)$$

If the memory cell array with the x input wiring lines and the y output wiring lines having the delay T$_{xy}$ are divided to have a group of sub cell arrays each having a certain number of input wiring lines and a certain number of output wiring lines to have a desired delay T$_m$, the delay can be controlled. In order to control the delay, x and y are chosen to meet the following formula (3).

$$\{R_{m1} \times y + R + R_{m2} \times (x-1)\} \times C \times x \leq T_m \quad (3)$$

This determines a maximum number of input wiring lines and a maximum number of output wiring lines to have a maximum delay time of each sub cell array to be equal to or less than T$_m$. A block including the sub cell array with the maximum number of Input wiring lines and the maximum number of output wiring line to meet the formula (3) would have the desired delay time T$_m$.

Figure 3:
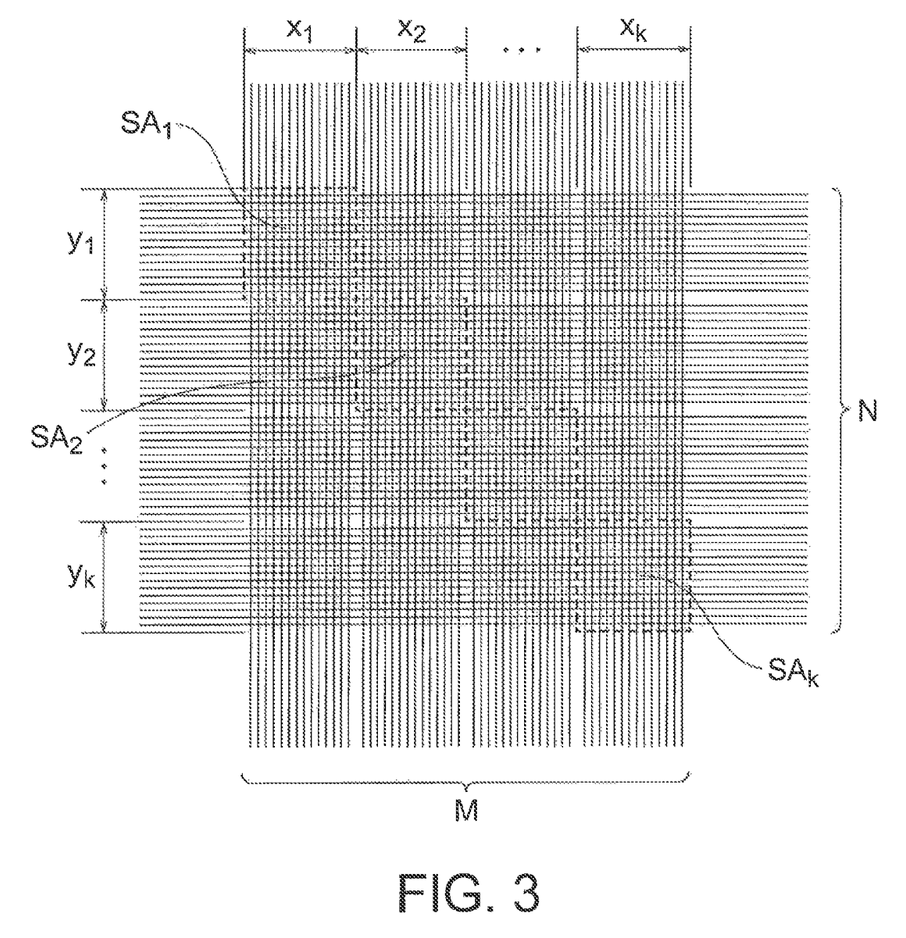
FIG. 3 is a diagram illustrating an example of the arrangement of sub cell arrays to cause a delay time of a memory cell array of a multiplexer (MUX) to be equal to or less than a desired delay time $T_m$.

If the delay time of a memory cell array of a MUX with M input wiring lines and N output wiring lines as shown in FIG. 3 should be equal to or less than T$_m$, each sub cell array is made to have x or less input wiring lines and y or less output wiring lines. The number of input wiring lines and the number of output wiring lines of each sub cell array are not necessarily equal to those of other sub cell arrays. For example, a memory cell array of a multi-input multi-output MUX with M input wiring lines and N output wiring lines may have k sub cell arrays SA$_1$ to SA$_k$ as shown in FIG. 3. Each sub cell array SA$_i$ (i=1, . . . , k) has x$_i$ Input wiring lines and y$_i$ output wiring lines.

The sub cell arrays of the memory cell array of the MUX may share input wiring lines but may not share output wiring lines. The memory cell array is reconfigured so that no memory element is present in intersection regions of the output wiring lines of a certain sub cell array SA$_i$ (i=1, . . . , k) and the input wiring lines that do not pass through the SA$_i$. In each sub cell array SA$_i$ (i=1, . . . , k), a memory element is present at an intersection region of one of the input wiring lines and one of the output wiring lines. The k sub cell arrays SA$_1$ to SA$_k$ do not have any common memory element.

As described above, the delay time of each sub cell array obtained by dividing the memory cell array may be adjusted to be equal to or less than T$_m$. The number of input wiring lines x$_i$ and the number of output wiring lines y$_i$ in each sub cell array SA$_i$ (i=1, . . . , k) meet the following formulas:

$$x_1 + x_2 + \ldots + x_a \leq M \quad (4A)$$

$$y_1 + y_2 + \ldots + y_k \leq N \quad (4B)$$

where a is a natural number equal to or less than k. If no sub cell arrays share input wiring lines, a is equal to k. If n sub cell arrays share input wiring lines, and each sub cell array has m$_j$ (j=1, . . . , n) cell arrays, $$a = k - (m_1 \text{ to } 1) - (m_2 \text{ to } 1) - \ldots - (m_n \text{ to } 1).$$

FIGS. 4A to 4D schematically show regions where memory elements are present and regions where no memory element is present in a memory cell array with M Input wiring lines and N output wiring lines as shown in FIG. 3. In FIGS. 4A to 4D, white regions indicate sub cell arrays, and regions with no memory element are hatched.

Figure 4A:
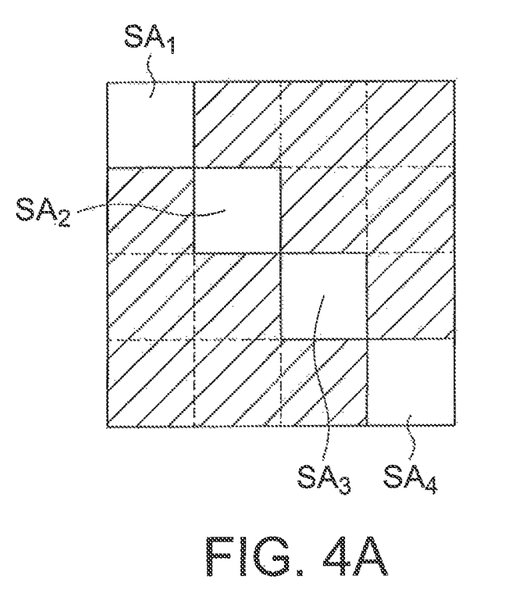
FIGS. 4A to 4D are diagrams showing examples of the arrangement of sub cell arrays.

FIG. 4A shows an example in which the total number of input wiring lines in four sub cell arrays SA$_1$ to SA$_4$ equals M, and the total number of output wiring lines equals N.

Figure 4B:
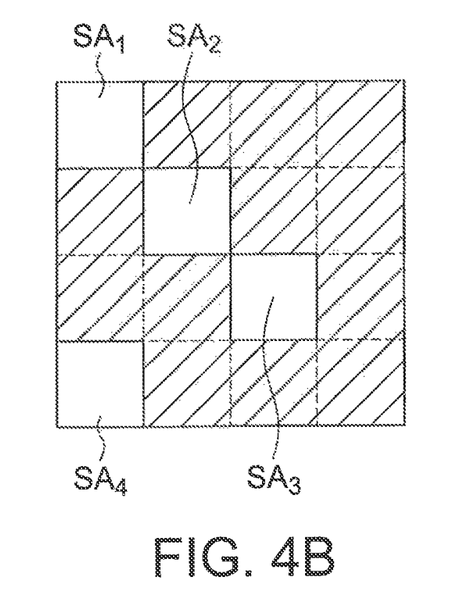

FIG. 4B shows an example in which the total number of input wiring lines in four sub cell arrays SA$_1$ to SA$_4$ is less than M, and the total number of output wiring lines equals N.

Figure 4C:
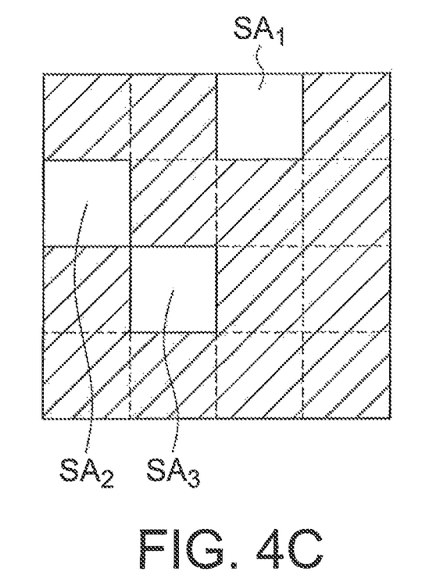

FIG. 4C shows an example in which the total number of input wiring lines in three sub cell arrays SA$_1$ to SA$_3$ is less than M, and the total number of output wiring lines is less than N.

In this case, there is an unused sub cell array.

Figure 4D:
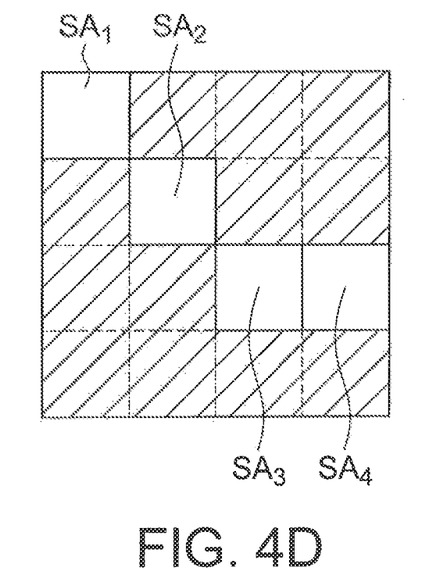

FIG. 4D shows an example in which the total number of Input wiring lines in four sub cell arrays SA$_1$ to SA$_4$ is M, and the total number of output wiring lines is less than N.

No memory element is present in Intersection regions of the output wiring lines of a certain sub cell array SA$_i$ (i=1, . . . , k) and the input wiring lines other than those of the sub cell array SA$_i$ as shown in FIGS. 4A to 4C in the embodiments. Thus, the example shown in FIG. 4D is not allowed, in which the sub cell array SA$_3$ and the sub cell array SA$_4$ share the output wiring lines instead of Input wiring lines.

Figure 5A:
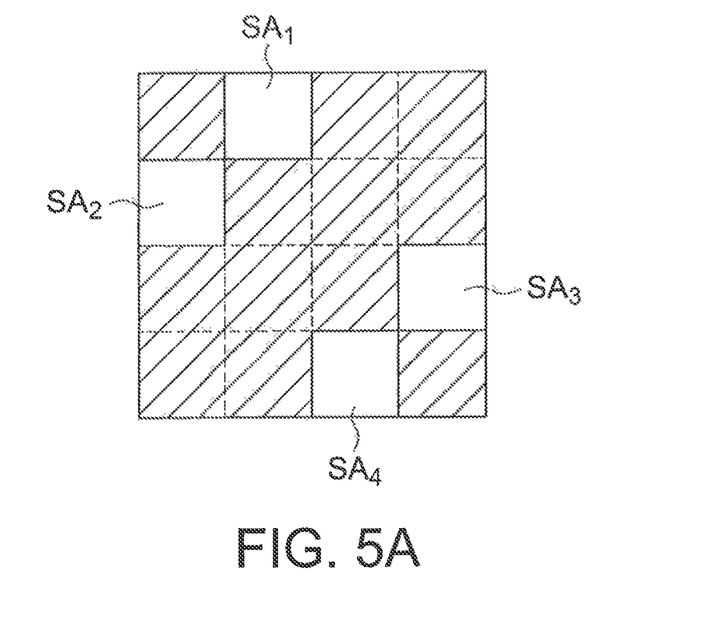
FIGS. 5A and 5B are diagrams showing examples of the arrangement of sub cell arrays.
Figure 5B:
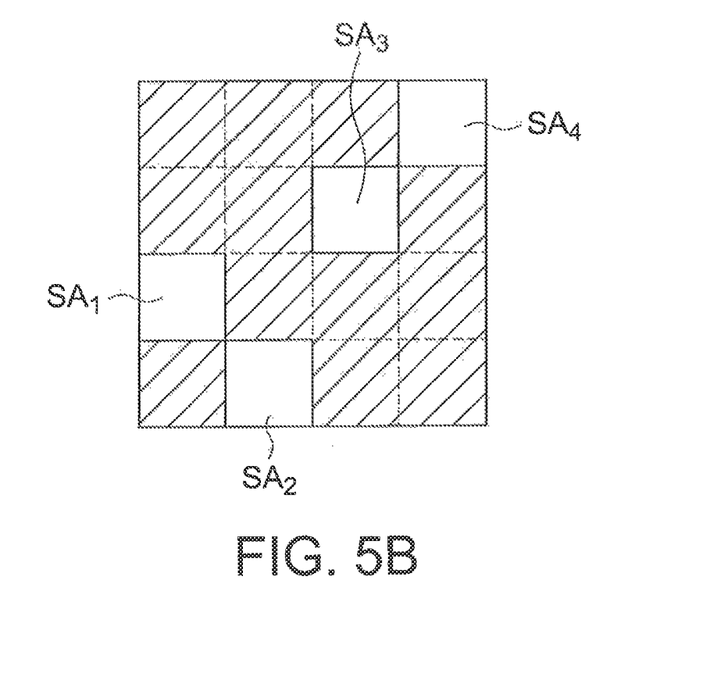

There are arrangements other than those shown in FIGS. 4A to 4C. For example, FIGS. 5A and 5B show arrangements of the sub cell arrays similar to but different from the arrangement shown in FIG. 4A. In FIGS. 5A and 5B, the total number of input wiring lines in four sub cell arrays SA$_1$ to SA$_4$ is M, and the total number of output wiring lines is N. There are 24 (=4×3×2×1) arrangements in which the total number of input wiring lines is M and the total number of output wiring lines is N in the four sub cell arrays SA$_1$ to SA$_4$.

In a multi-input multi-output MUX In which the memory cell array is reconfigured to have a plurality of sub cell arrays as described above, the delay time is equal to or less than a desired time, and the number of memory elements may be reduced. Therefore, the area of the MUX in a chip may be reduced.

Hereinafter, embodiments of the multi-input multi-output MUX will be described.

(First Embodiment)

Figure 6:
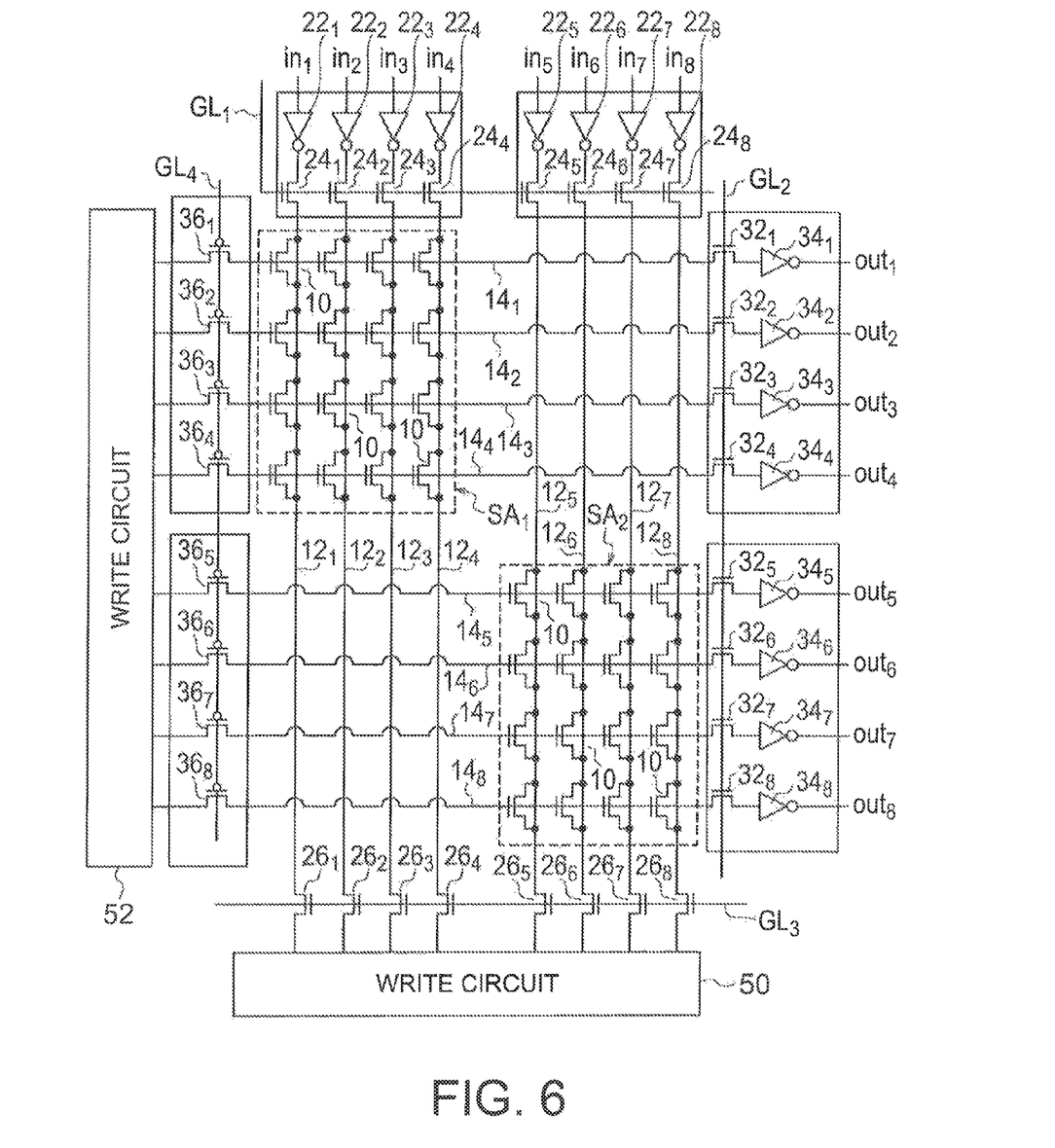
FIG. 6 is a diagram showing a memory of a MUX according to a first embodiment.

A multi-input multi-output MUX ("MUX") according to a first embodiment will be described with reference to FIG. 6. The MUX according to the first embodiment is used to replace a switch block in an FPGA, for example, and includes a memory. FIG. 6 shows the memory. The memory includes a memory cell array, input wiring lines in$_1$ to in$_8$, output wiring lines out$_1$ to outs, inverters (buffers) 22$_1$ to 22$_8$, selection transistors 24$_1$ to 24$_8$, write selection transistors 26$_1$ to 26$_8$, cut-off transistors 32$_1$ to 32$_8$, inverters (buffers) 34$_1$ to 34$_8$, write selection transistors 36$_1$ to 36$_8$, and write circuits 50 and 52. The memory cell array includes sub cell arrays SA$_1$ and SA$_2$, first internal wiring lines 12$_1$ to 12$_8$, and second internal wiring lines 14$_1$ to 14$_8$. Although the selection transistors 36$_1$ to 36$_8$ in the first embodiment are p-channel transistors, they may be n-channel transistors.

The input terminal of each inverter 22$_i$ (i=1, . . . , 8) is connected to the input wiring line in$_i$, and the output terminal is connected to one of the source and the drain of the selection transistor 24$_i$. The other of the source and the drain of the selection transistor 24$_i$ (i=1, . . . , 8) is connected to one end of the first internal wiring line 12$_i$. Thus, the input wiring line in$_i$ (i=1, . . . , 8) is connected to the first internal wiring line $12_i$ via the inverter $22_i$ and the selection transistor $24_i$. The other end of the first internal wiring line $12_i$ (i= 1, ..., 8) is connected to the write circuit 50 via the selection transistor $26_i$. The gate of each of the selection transistors $24_1$ to $24_8$ is connected to a wiring line $GL_1$, and the gate of each of the selection transistors $26_1$ to $26_8$ is connected to a wiring line $GL_3$.

One end of each second internal wiring line $14_j$ (j= 1, ..., 8) is connected to one of the source and the drain of the cut-off transistor $32_j$, and the other end is connected to one of the source and the drain of the selection transistor $36_j$. The other of the source and the drain of the selection transistor $32_j$ (j=1, ..., 8) is connected to the input terminal of the inverter $34j$. The output terminal of the inverter $34_j$ (j=1, ..., 8) is connected to the output wiring line $out_j$. Thus, the second internal wiring line $14_j$ (j=1, ..., 8) is connected to the output wiring line $out_j$ via the selection transistor $32j$ and the inverter $34_j$. The other of the source and the drain of each of the selection transistors $36_1$ to $36_9$ is connected to the write circuit 52. The gate of each of the selection transistors $32_j$ to $32_8$ is connected to a wiring line $GL_2$, and the gate of each of the selection transistors $36_1$ to $36_8$ is connected to a wiring line $GL_4$.

Figure 11:
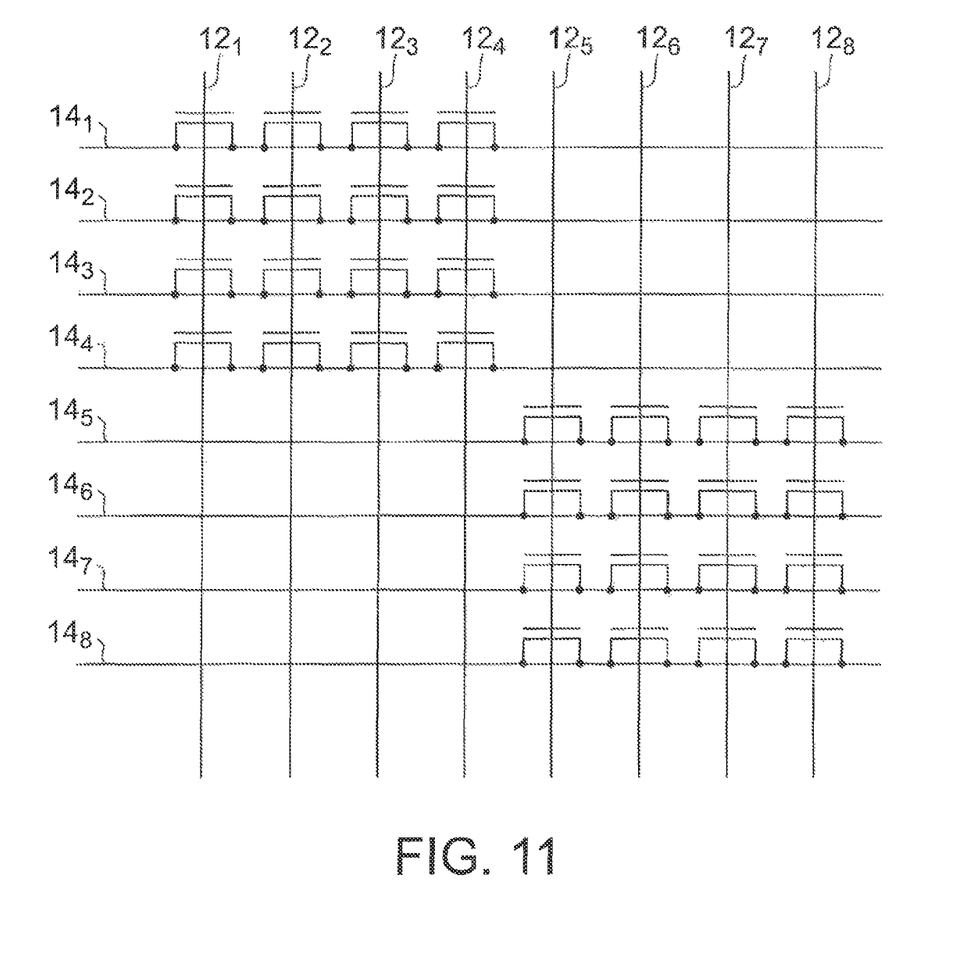
FIG. 11 is a diagram showing a memory cell array of a MUX according to a modification of the first embodiment.

The sub cell array $SA_1$ includes memory elements 10 in intersection regions of the first internal wiring lines $12_1$ to $12_4$ and the second Internal wiring lines $14_1$ to $14_4$. The sub cell array $SA_2$ includes memory elements 10 in intersection regions of the first Internal wiring lines $12_5$ to $12_8$ and the second internal wiring lines $14_5$ to $14_8$. A first terminal of each memory element 10 is connected to a corresponding first Internal wiring line, and a second terminal thereof is connected to a corresponding second Internal wiring line. The memory element 10 in the first embodiment is a MOS transistor as shown in FIG. 6. The MOS transistor includes a source and a drain that are separately disposed in a semiconductor layer, a gate disposed above a region of the semiconductor layer serving as a channel between the source and the drain, and a gate insulating film disposed between the channel and the gate. In the first embodiment, the source and the drain of each MOS transistor are connected to a corresponding one of the first internal wiring lines $12_1$ to $12_8$, and the gate is connected to a corresponding one of the second internal wiring lines $14_1$ to $14_8$ as shown in FIG. 6. At least one of the source and the drain may be connected to a corresponding one of the second Internal wiring lines $14_1$ to $14_8$, and the gate may be connected to a corresponding one of the first internal wiring lines $12_1$ to $12_8$ as shown in FIG. 11. Incidentally, in FIG. 11, both the source and the drain are connected to a corresponding one of the second internal wiring lines $14_1$ to $14_8$.

In the first embodiment, the memory elements are present only in the intersection regions of the first internal wiring lines and the second internal wiring lines in the sub cell arrays $SA_1$ and $SA_2$, and no memory element is present in other intersection regions, i.e., the intersection regions of the first Internal wiring lines $12_1$ to $12_4$ and the second internal wiring lines $14_5$ to $14_8$, and the intersection regions of the first internal wiring lines $12_5$ to $12_8$ and the second internal wiring lines $14_1$ to $14_4$. The sub cell arrays $SA_1$ and $SA_2$ do not overlap each other. Therefore, the sub cell arrays do not have any common memory element.

Since no memory element is present in the intersection regions of the first internal wiring lines and the second internal wiring lines except for those in the sub cell arrays $SA_1$ and $SA_2$ in the first embodiment, the delay time of a signal passing through each sub cell array may be controlled to be within a desired time, and the area occupied by the memory cell array in the chip may be reduced. As described above, each sub cell array is formed in the memory cell array so that the delay time of a signal passing through each sub cell array may be within the desired time.

Figure 7:
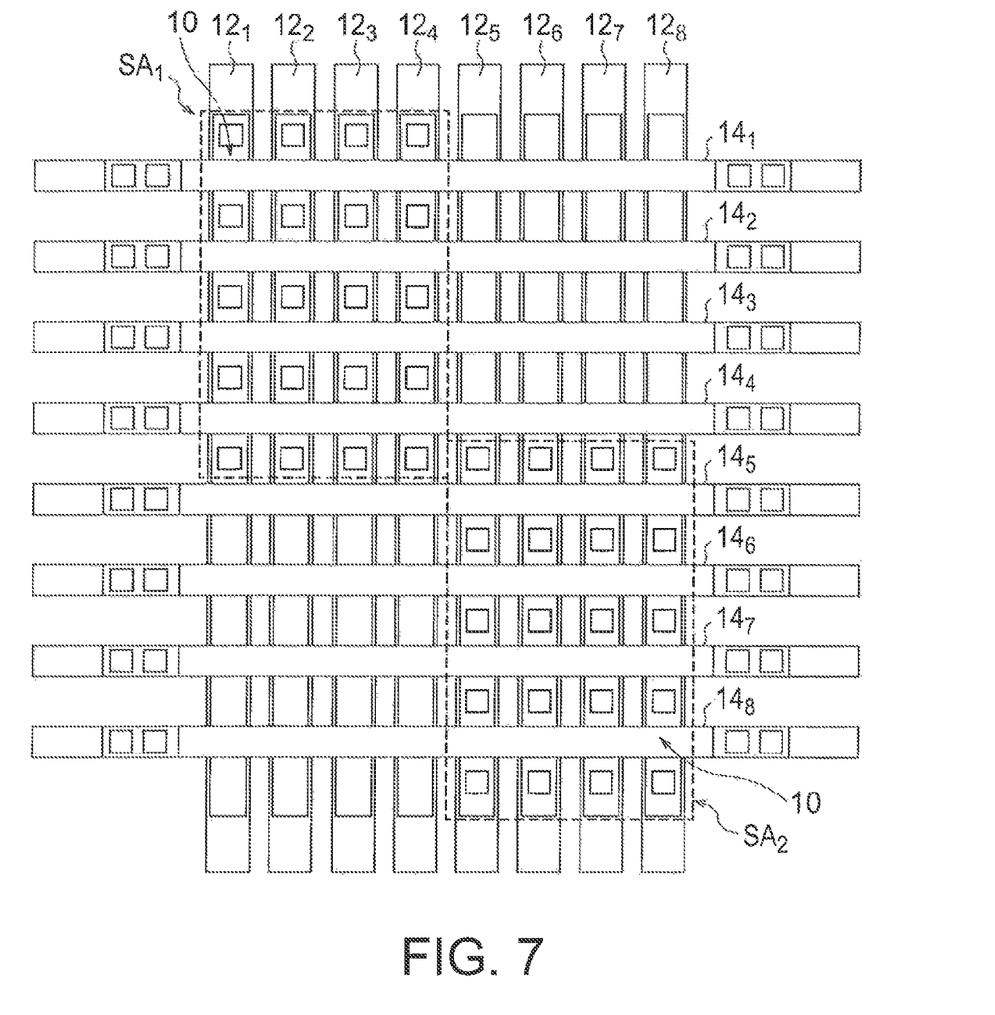
FIG. 7 is a diagram showing an example of layers of a memory cell array of the MUX according to the first embodiment.

FIG. 7 shows a layout of the memory cell array according to the first embodiment. The memory cell array in this example has two sub cell arrays. The number of sub cell arrays may be arbitrarily determined, and the arrangement of the sub cell arrays may be modified in accordance with the number of sub cell arrays to have the same effect.

As described above, a MOS transistor is used as the memory element 10 in the first embodiment. The MOS transistor is written by breaking the gate insulating film of the MOS transistor. Therefore, the MOS transistor serves as a one-time programmable ("OTP") element. There are various types of anti-fuse memory elements including OTP elements. The MOS transistors serving as the memory elements 10 may be arranged to have a cross-point array configuration.

The write operation to the OTP element includes applying a write voltage $V_{prg}$ to the gate of the OTP element, and applying a ground voltage to the source and the drain of the OTP element. This breaks down the gate insulating film and forms a conductive path between the gate and the source, or the gate and the drain. The OTP element with the conductive path has a low resistance. The other OTP elements on which no write operation is performed are in a high-resistance state since no conductive path is formed between the gate and the source, or the gate and the drain of each of these OTP elements.

$R_{ox}$, which is the resistance between the gate and the source (or the gate and the drain), and the capacitance C1, which is the capacitance of one cross-point memory, and is a sum of the gate capacitance and the wiring capacitance of the transistor serving as the OTP element, are substituted into the formula (3) to have the following formula (5):

$$\{R_{m1} \times y + R_{ox} + R_{m2} \times (x-1)\} \times C1 \times x \leq T_m \qquad (5)$$

where $R_{m1}$ is the resistance of the input wiring line. In FIG. 6, it is the wiring line resistance of the input wiring line $12_i$ (i=1, ..., 8) to which the source and the drain of the memory element are connected. The wiring line $12_i$ (i=1, ..., 8) in FIG. 7 is a metal wiring line. The wiring line resistance in this case is a resistance of one memory region. $R_{m2}$ is the resistance of the output wiring line. The wiring line $14_i$ (i= 1, ..., 8) is formed by gates of polycrystalline silicon of the memory element in the memory array shown in FIG. 7. $R_{m2}$ is a resistance of the gate of polycrystalilne silicon in one memory region.

(Write Method)

A write method for the memory cell array according to the first embodiment will be described with reference to FIG. 6. Writing is performed in units of sub cell arrays. Writing to the memory element 10 in the intersection region of the first internal wiring line $12_1$ and the second internal wiring line $14_1$ in the sub cell array $SA_1$ will be described below as an example.

First, the selection transistors $24_1$ to $24_8$ are turned OFF, and the cut-off transistors $32_1$ to $32_8$ are also turned OFF. Thereafter, the selection transistors $26_1$ to $26_8$ are turned ON, and the selection transistors $36_1$ to $36_8$ are also turned ON. Then, a write voltage $V_{prg}$ is applied to the second internal wiring line $14_1$ by the write circuit 52, a ground voltage (0 V) Is applied via the selection transistor $26_1$ to $26_4$ to the first internal wiring line $12_1$ by the write circuit 50, and a write inhibit voltage (for example, $V_{prg}/2$) is applied to the first internal wiring lines $12_2$ to $12_4$. A write operation is performed on the memory element 10 in the intersection region of the first internal wiring line $12_1$ and the second internal wiring line $14_1$ in the sub cell array $SA_1$ in this manner. A voltage that is less than the write voltage is applied between the gate and the source, and between the gate and the drain of each of the other memory elements connected to the second internal wiring line $12_1$ in the sub cell array $SA_1$. Therefore, the gate insulating films of these memory elements are not broken, and thus these memory elements are not written.

(Operation)

The operation of the MUX according to the first embodiment will be described with reference to FIG. 6.

First, the write selection transistors $26_1$ to $26_8$ and $36_1$ to $36_8$ are turned OFF. Subsequently, the selection transistors $24_1$ to $24_8$ are turned ON and the cut-off transistors $32_1$ to $32_8$ are also turned ON. This allows input signals sent to the MUX via the input wiring lines $in_1$ to $in_8$ to be outputted from the output wiring lines $out_1$ to outs as signals corresponding to the resistance states of the corresponding memory elements 10 in the sub cell arrays $SA_1$ and $SA_2$ of the MUX.

As described above, according to the first embodiment, the delay time of a signal passing through either the sub cell array $SA_1$ or $SA_2$ may be reduced to be within a desired time, and the area of the memory cell array in the chip may be reduced since the memory elements are present in intersection regions of the first internal wiring lines and the second internal wiring lines only in the sub cell arrays $SA_1$ and $SA_2$.

(Second Embodiment)

Figure 8:
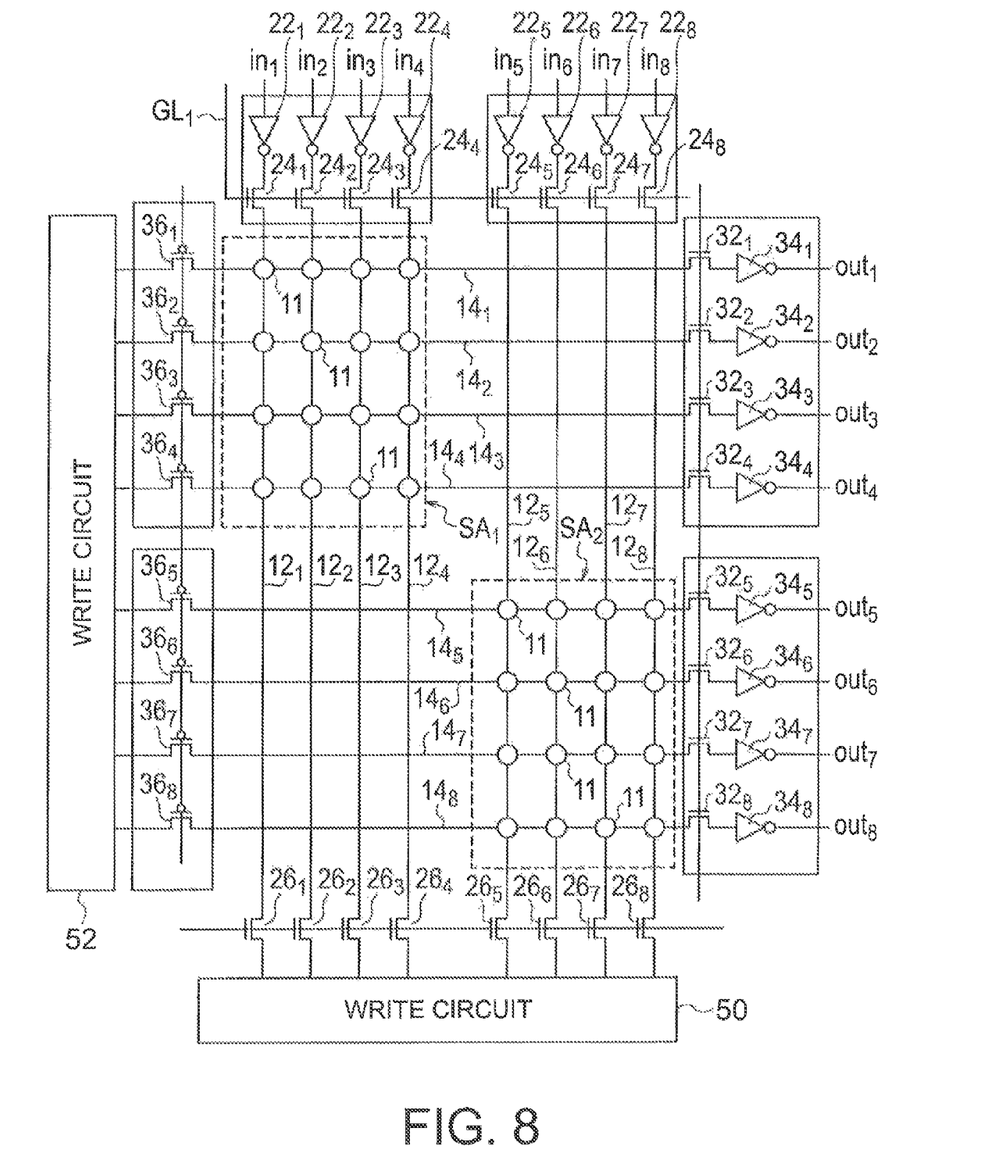
FIG. 8 is a diagram showing a memory of a MUX according to a second embodiment.

A multi-input multi-output MUX according to a second embodiment will be described with reference to FIG. 8. The MUX according to the second embodiment is obtained by replacing the memory elements 10, which are OTP elements, of the MUX according to the first embodiment shown in FIG. 6 with resistive change memory elements 11. The memory elements 11 are disposed in circled regions in FIG. 8, at which the first internal wiring lines and the second internal wiring lines Intersect each other in the sub cell arrays $SA_1$ and $SA_2$.

Figure 9:
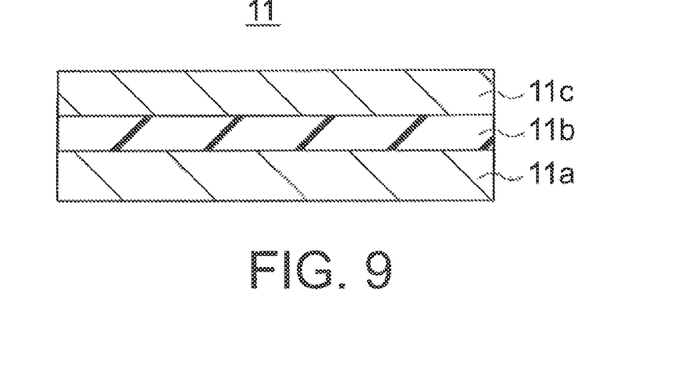
FIG. 9 is a cross-sectional view showing the structure of a resistive change memory element.

Each resistive change memory element 11 includes a first electrode 11a, a second electrode 11c, and a resistive change layer 11b disposed between the first electrode 11a and the second electrode 11c, as shown in FIG. 9. The resistive change layer 11b is formed of, for example, a metal oxide, and a first electrode 11a and a second electrode 11c are metal layers. In the second embodiment, the second electrode 11c is connected to the first internal wiring line, and the first electrode is connected to the second internal wiring line. However, the first electrode may be connected to the first internal wiring line, and the second electrode may be connected to the second internal wiring line. The resistive change memory element 11 is switched between a high-resistance state and a low-resistance state when predetermined write voltages are applied between the first electrode 11a and the second electrode 11c. For example, applying a set voltage between the first electrode 11a and the second electrode 11c changes the resistive change memory element 11 from a high-resistance state to a low-resistance state, and applying a reset voltage changes the resistive change memory element 11 from the low-resistance state to the high-resistance state. Therefore, in the second embodiment, two levels of write voltage are used.

Also in the second embodiment, the delay time $T_{xy}$ of the longest path between the input and the output in the memory cell array with x Input wiring lines and y output wiring lines can be expressed by the following formula (6):

$$T_{xy} = \{R_{m1} \times y + R + R_{m2} \times (x-1)\} \times C2 \times x \quad (6)$$

where R is the resistance of the resistive change memory element 11 after the write operation, $R_{m1}$ is the wiring resistance of one memory cell region of the input wiring line, and $R_{m2}$ is the wiring resistance of one memory cell region of the output wiring line. C2 is the wiring capacitance of one memory cell region.

The delay time $T_{xy}$ of the memory cell array with x Input wiring lines and y output wiring lines may be controlled by adjusting the number of input wiring lines and the number of output wiring lines in the sub cell arrays. The delay time $T_m$ for a maximum number of wiring lines can be determined by the following formula (7):

$$\{R_{m1} \times y + R + R_{m2} \times (x-1)\} \times C2 \times x \leq T_m \quad (7)$$

The number of sub cell arrays each corresponding to one block and each meeting the above formula can also be obtained by the formula (7).

Figure 10:
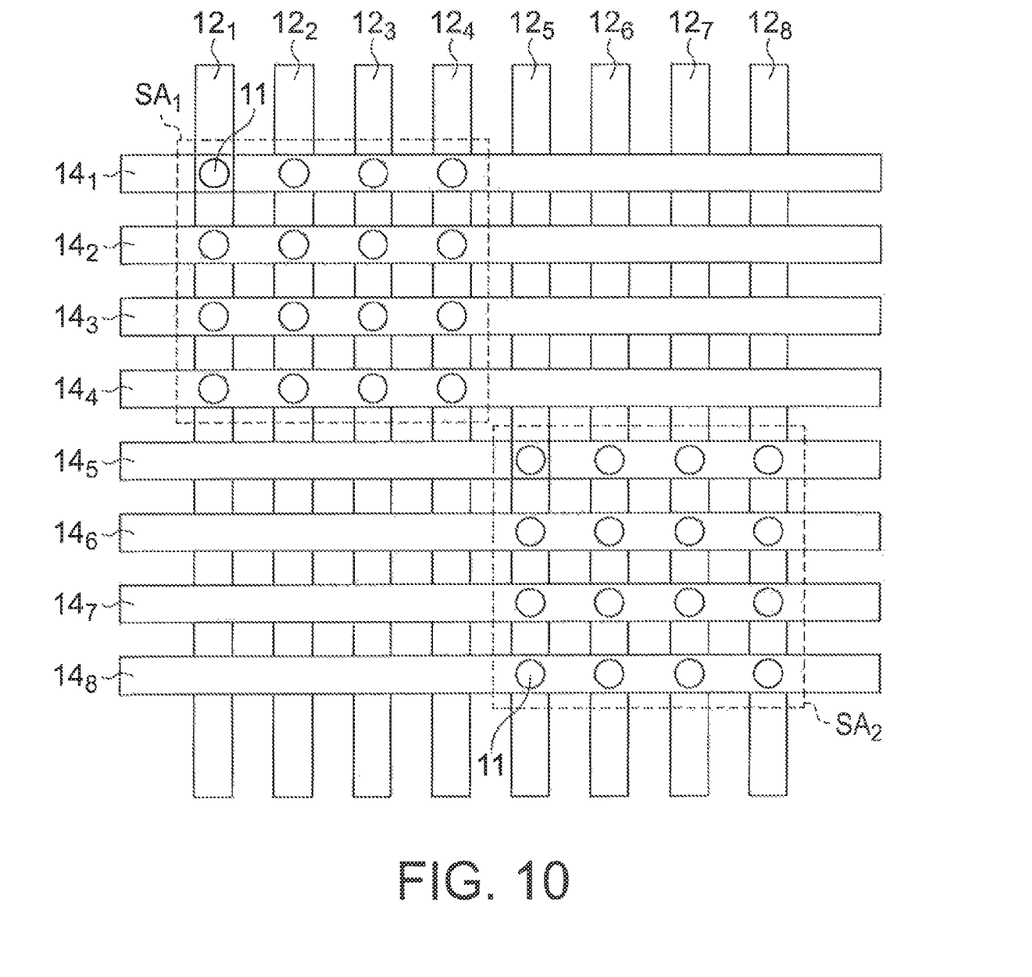
FIG. 10 is a diagram showing an example of the layout of a memory cell array of the MUX of the second embodiment.

FIG. 10 shows an example of the layout of a memory cell array according to the second embodiment. This example shows two sub cell arrays, but the number of sub cell arrays may be arbitrarily determined, and the same effect can be obtained by arranging the sub cell arrays in accordance with the number of the sub cell arrays.

The write method and the operation method of the MUX according to the second embodiment are the same as those of the first embodiment.

Since the memory elements of the second embodiment are present in intersection regions of the first internal wiring lines and the second internal wiring lines in the sub cell arrays $SA_1$ and $SA_2$ like the first embodiment, the delay time of a signal passing through the sub cell array $SA_1$ or $SA_2$ may be reduced to be within a desired time, and the area of the memory cell array in the chip may be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
   a plurality of first wiring lines electrically connected to a plurality of input wiring lines;
   a plurality of second wiring lines electrically connected to a plurality of output wiring lines, the second wiring lines crossing the first wiring lines; and
   a plurality of cell arrays each of which includes memory elements disposed at intersection regions of a part of the first wiring lines and a part of the second wiring lines, each of the memory elements including a first terminal and a second terminal, the first terminal being electrically connected to one of the first wiring lines, the second terminal being electrically connected to one of the second wiring lines, and each of the second wiring lines being electrically connected to at most one of the cell arrays,
   wherein the circuit does not comprise the memory elements in intersection regions of the first wiring lines and the second wiring lines other than the part of the first wiring lines electrically connected to one of the cell arrays and the part of the second wiring lines electrically connected to the one of the cell arrays.

2. The circuit according to claim 1, wherein the plurality of the first wiring lines include third wiring lines and fourth wiring lines, the plurality of the second wiring lines include fifth wiring lines and sixth wiring lines, a cell array including memory elements is disposed at an intersection region of the third wiring lines and the fifth wiring lines, a cell array including memory elements is disposed at an intersection region of the fourth wiring lines and the sixth wiring lines, and an intersection region of the third wiring lines and the fifth wiring lines and an intersection region of the fourth wiring lines and the fifth wiring lines do not include the memory elements.

3. The circuit according to claim 1, wherein the circuit does not comprise the memory elements in a region other than the cell arrays.

4. The circuit according to claim 1, wherein the memory elements are transistors each including a source, a drain, a gate disposed above a channel between the source and the drain, and a gate insulating film disposed between the channel and the gate, either the source or the drain being one of the first terminal and the second terminal, and the gate being the other.

5. The circuit according to claim 1, wherein each of the memory elements includes a first electrode, a second electrode, and a resistive change layer disposed between the first electrode and the second electrode, the first electrode being the first terminal and the second electrode being the second terminal.

6. The circuit according to claim 1, further comprising a write circuit configured to apply a write voltage between the first terminal and the second terminal of the memory element.

7. The circuit according to claim 1, further comprising inverters and transistors between the first wiring lines and the input wiring lines.

8. The circuit according to claim 1, further comprising inverters and transistors between the second wiring lines and the output wiring lines.

9. The circuit according to claim 1, wherein the plurality of the first wiring lines are disposed in a first level and the plurality of the second wiring lines are disposed in a second level different from the first level.

10. A semiconductor integrated circuit comprising:
a plurality of first wiring lines electrically connected to a plurality of input wiring lines;
a plurality of second wiring lines electrically connected to a plurality of output wiring lines, the second wiring lines crossing the first wiring lines; and
a plurality of cell arrays each of which includes memory elements disposed at intersection regions of a part of the first wiring lines and a part of the second wiring lines, each of the memory elements including a first terminal and a second terminal, the first terminal being electrically connected to one of the first wiring lines, and the second terminal being electrically connected to one of the second wiring lines,
wherein the circuit does not comprise the memory elements in intersection regions of the first wiring lines and the second wiring lines other than the part of the first wiring lines electrically connected to one of the cell arrays and the part of the second wiring lines electrically connected to the one of the cell arrays.

11. The circuit according to claim 10, wherein the circuit does not comprise the memory elements in a region other than the cell arrays.

12. The circuit according to claim 10, wherein the memory elements are transistors each including a source, a drain, a gate disposed above a channel between the source and the drain, and a gate insulating film disposed between the channel and the gate, either the source or the drain being one of the first terminal and the second terminal, and the gate being the other.

13. The circuit according to claim 10, wherein each of the memory elements includes a first electrode, a second electrode, and a resistive change layer disposed between the first electrode and the second electrode, the first electrode being the first terminal and the second electrode being the second terminal.

14. The circuit according to claim 10, further comprising a write circuit configured to apply a write voltage between the first terminal and the second terminal of the memory element.

15. The circuit according to claim 10, further comprising inverters and transistors between the first wiring lines and the input wiring lines.

16. The circuit according to claim 10, further comprising inverters and transistors between the second wiring lines and the output wiring lines.

17. The circuit according to claim 10, wherein the plurality of the first wiring lines include third wiring lines and fourth wiring lines, the plurality of the second wiring lines include fifth wiring lines and sixth wiring lines, a cell array including memory elements is disposed at an intersection region of the third wiring lines and the fifth wiring lines, a cell array including memory elements is disposed at an intersection region of the fourth wiring lines and the sixth wiring lines, and an intersection region of the third wiring lines and the fifth wiring lines and an intersection region of the fourth wiring lines and the fifth wiring lines do not include the memory elements.

18. The circuit according to claim 10, wherein the plurality of the first wiring lines are disposed in a first level and the plurality of the second wiring lines are disposed in a second level different from the first level.

19. A semiconductor integrated circuit comprising:
a plurality of first wiring lines electrically connected to a plurality of input wiring lines;
a plurality of second wiring lines electrically connected to a plurality of output wiring lines, the second wiring lines crossing the first wiring lines; and
a plurality of cell arrays each of which includes resistive elements disposed at intersection regions of a part of the first wiring lines and a part of the second wiring lines, each of the resistive elements including a first terminal, a second terminal, and a resistive layer disposed between the first terminal and the second terminal, the first terminal being electrically connected to one of the first wiring lines, the second terminal being electrically connected to one of the second wiring lines, and each of the second wiring lines being electrically connected at most one of the cell arrays,
wherein the circuit does not comprise the memory elements in intersection regions of the first wiring lines and the second wiring lines other than the part of the first wiring lines electrically connected to one of the cell arrays and the part of the second wiring lines electrically connected to the one of the cell arrays.

20. The circuit according to claim 19, wherein the circuit does not comprise the resistive elements in a region other than the cell arrays.

21. The circuit according to claim 19, wherein the plurality of the first wiring lines include third wiring lines and fourth wiring lines, the plurality of the second wiring lines include fifth wiring lines and sixth wiring lines, a cell array including memory elements is disposed at an intersection region of the third wiring lines and the fifth wiring lines, a cell array including memory elements is disposed at an intersection region of the fourth wiring lines and the sixth wiring lines, and an intersection region of the third wiring lines and the fifth wiring lines and an intersection region of the fourth wiring lines and the fifth wiring lines do not include the memory elements.

22. The circuit according to claim 19, wherein the plurality of the first wiring lines are disposed in a first level and the plurality of the second wiring lines are disposed in a second level different from the first level.

* * * * *